United States Patent [19]

Devenyi et al.

[11] 4,389,557
[45] Jun. 21, 1983

[54] SEMICONDUCTOR LASER BONDING TECHNIQUE

[75] Inventors: Tibor F. Devenyi, Nepean; Tibor F. I. Kovats, Ottawa; Christopher M. Look, Nepean, all of Canada

[73] Assignee: Northern Telecom Limited, Montreal, Canada

[21] Appl. No.: 293,112

[22] Filed: Aug. 17, 1981

[51] Int. Cl.³ .......................................... H01L 21/58
[52] U.S. Cl. .......................... 219/85 CM; 219/85 M; 219/85 CA; 228/222; 228/123
[58] Field of Search ......... 219/85 CA, 85 CM, 85 M, 219/85 R; 29/573, 574, 593, 831, 832, 739, 740; 264/27; 174/16 HS; 228/222, 103, 104, 123

[56] References Cited

U.S. PATENT DOCUMENTS 2,978,570  4/1961  Hänlein ........................ 219/85 CM
4,142,662  3/1979  Holbrook et al. ................. 228/123
4,321,617  3/1982  Duda et al. ........................ 228/123

*Primary Examiner*—B. A. Reynolds
*Assistant Examiner*—Catherine M. Sigda
*Attorney, Agent, or Firm*—Stuart L. Wilkinson

[57] ABSTRACT

In a method and apparatus for bonding a semiconductor laser chip to a heatsink and testing the bond obtained, temperature in the bonding operation is regulated by passing a small fixed current through the forward biased laser and monitoring corresponding change in voltage caused by alteration of the laser pn junction temperature. Current is passed to the laser through a floating contact consisting of a conducting vacuum pick-up pressed against the laser top surface. Bond integrity is subsequently tested at low temperature by passing a dc current greater than a threshold current through the laser and measuring the resulting light output and then passing a pulsed current with identical peak current level and again measuring light output. The difference in light output is a function of the bond thermal resistance.

14 Claims, 3 Drawing Figures

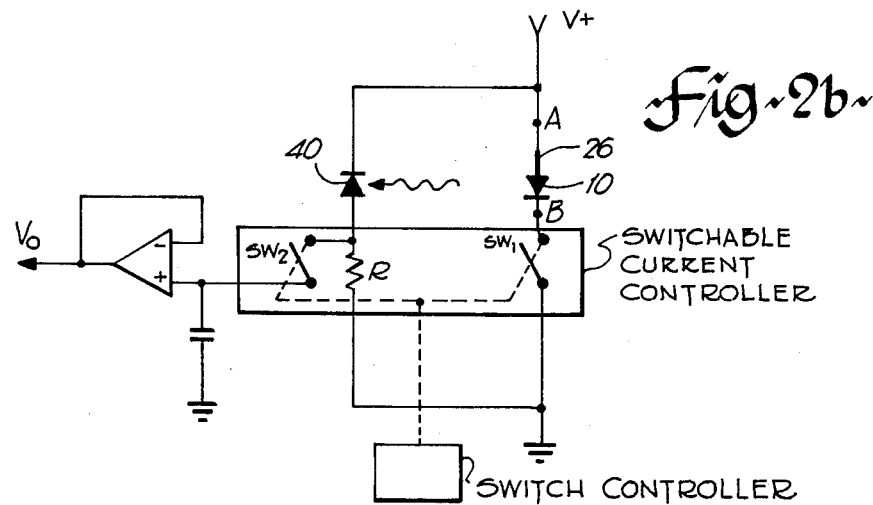
Fig-2b-
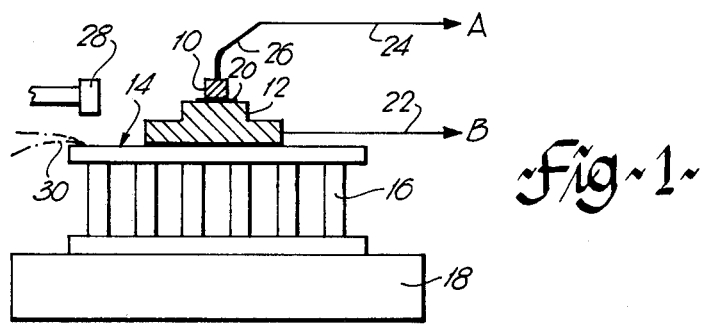
Fig-1-
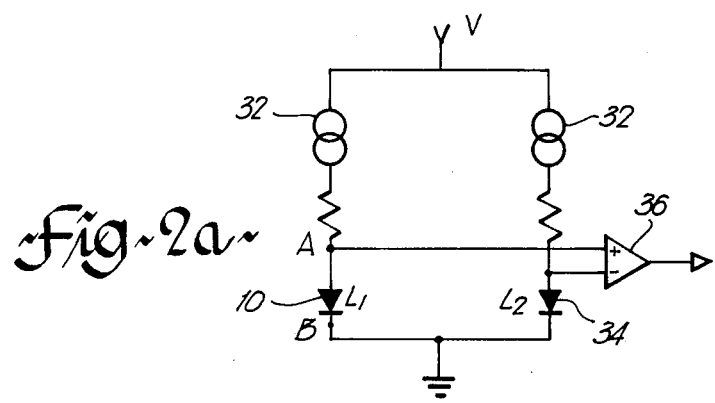
Fig-2a-

SEMICONDUCTOR LASER BONDING TECHNIQUE

This invention relates to a method and apparatus for bonding a semiconductor laser chip to a heatsink and for testing the integrity of a bond obtained thereby.

When operating a semiconductor laser source in a fiber optic communication link, a large amount of heat is generated and must be conducted away from the laser since light output obtained for a particular applied current above laser threshold decreases markedly if the temperature of the laser is increased. In addition, at high temperature, semiconductor lasers degrade more rapidly than at low temperature. To maintain a low operating temperature, the laser chip is bonded to a highly conductive heatsink of, for example, copper which is itself cooled by a thermoelectric cooler. The efficiency of the heatsink/cooler combination is, however, only as good as the bond between the laser and the heatsink. If the bond has a high thermal resistance, then heat is retained within the laser and consequently both its light output and lifetime are reduced.

In known semiconductor laser production, the two operations of bonding and bond testing are relatively slow and performed at separate locations. In a known bonding method, a film of indium is deposited onto a top surface portion of a copper heatsink by vapour deposition or as small particles scraped from an indium block. The heatsink is then positioned on a carbon resistor strip at a constricted region of the strip. The laser chip is then lodged at the desired site on the heatsink and a contact pressure of from 10 to 100 gm is applied to it. A current of the order of 30 amps is then passed through the resistor strip to generate a temperature of about 170° C. at the constricted zone. When the solder melts, the intervening solder layer conforms closely to the contours of the heatsink top surface and the laser chip bottom surface and should establish good thermal contact with both. The temperature of the carbon resistor which is monitored using a thermocouple is used to predict and control the bond temperature. This method of temperature monitoring is however, somewhat imprecise and may be subject to fluctuation, since any movement of the chip on the resistor can materially alter the thermal contact between the carbon resistor and the chip. Also if current through the carbon resistor strip is altered to restore a desired laser temperature, the high thermal capacity of the heating system can lead to overcompensation. Ideally a temperature of the order of 170° which is several degrees above the melting point of indium is attained to avoid any dry regions in the solder. On the other hand, the temperature of the bond region should not be raised too high otherwise it can cause formation of defects in the laser crystal. This prior bonding system has no capability for forced cooling and so is not adapted for high rate production of bonded laser chips. Following bonding, it is necessary to carry out characterization tests on bonded laser chips to ensure that there are no electrical shorts and that the thermal resistance of the bond is within acceptable limits. In the known production methods, the bonded chips are allowed to cool to room temperature and are taken from the soldering apparatus to a test bed where characterization tests are preformed. Briefly, a wire is bonded to the laser top surface and another wire bonded to the heatsink. At controlled temperature, a dc current of about 100 mA and a pulsed current of identical peak level are passed through the laser. Corresponding light outputs are monitored, a difference being an indication of temperature difference at the pn junction. That temperature difference is, in turn, a measure of the thermal resistance of the bond.

A bonding and testing technique is now proposed which permits both the precise control of the laser soldering temperature and the rapid characterization of the bond obtained in situ, i.e. without removing the bonded chip and heatsink from the soldering apparatus.

According to one aspect of the invention there is provided a method of bonding a semiconductor laser chip to a heatsink comprising depositing solder on the heatsink, positioning and pressing the chip onto the solder, passing a small fixed current through the laser in a forward bias direction, applying regulated heat to the heatsink to render the solder molten, measuring a change in voltage across the laser chip caused by such heating to determine the temperature of a pn junction of said laser chip, regulating the applied heat on the basis of that predetermined temperature, and cooling the solder to render it solid and to bond the laser chip to the heatsink.

The voltage change can be measured by passing a current equal to said small preset current through a reference laser, the two lasers having been cleaved from a common wafer. The reference laser is maintained at a predetermined constant temperature, the voltage charge being determined by comparing the voltage across the two lasers. The small fixed current is preferably directed to the laser through a conducting vacuum pick-up. Heat can be supplied to melt the solder by means of a Peltier effect heating device with which the heatsink is in thermal contact. The Peltier effect device can be subsequently driven with reverse current polarity to cool and solidify the solder. The solder is preferably a low temperature melting point alloy containing indium.

The Peltier effect device and the conductive pick-up can be used to characterize the thermal resistance of the bond. The Peltier device is used to set a characterizing temperature and the pick-up is used to drive the laser by a direct current and a pulsed current, the pulsed current having a peak level equal to the dc current. Respective light outputs are then compared to determine the bond thermal resistance.

An embodiment of the invention will now be described by way of example with reference to the accompanying drawings, in which:

FIG. 1 is a cross-sectional view of bonding apparatus according to the invention;

FIG. 2(a) is a schematic view of an electrical circuit for precisely controlling the bonding temperature; and FIG. 2(b) is a schematic view of an electrical circuit for characterizing the thermal resistance of a laser-heatsink bond.

Referring in detail to the drawings, FIG. 1 shows a semiconductor laser chip 10 supported by a copper heatsink 12, the heatsink being supported by one face 14 of a thermoelectric device 16 functioning by the Peltier effect. Such a device having a temperature range of from room temperature to 170° C. is available under specification number 950-35-XHT from Borg Warner Corportion of the United States of America. The device 16 is supported by a water-cooled heatsink 18. A top surface of the heatsink has a 5 to 10 micron layer 20 of indium vapour-deposited upon it. A first lead 22 is bonded to a side surface of the heatsink 18. A second lead 24 is electrically connected to a gold or platinum plated vacuum pick-up 26. The hollow pick-up can thus be used to pick-up, drop and move the laser chip laterally to an optimum position for directing light output. Since the pick-up is conducting, it is used also to pass current to the laser top surface. The thermoelectric device 16 functions with one current polarity to render the surface 14 relatively hot while with reversed current polarity, the surface 14 is cooled. Also present in the bonding and test bed are a photodetector 28, for example a PIN photodiode, and a thermocouple 30 attached to the thermoelectric device top surface 14.

Referring now to FIG. 2, there are shown two circuits 2(a) and 2(b) which can be electrically connected exclusively to terminals A and B shown in FIG. 1. The circuit of FIG. 2(a) is used to precisely control the bonding temperature, while the circuit of FIG. 2(b) is used to characterize the bond obtained. The primary features of the FIG. 2(a) circuit are constant current sources 32 from which identical currents pass through the laser 10 being bonded and a reference laser 34 cleaved from the same wafer as the laser 10. The monitoring current is of the order of 1 mA which is well below laser threshold. The reference laser 34 is maintained at a preset temperature and the voltage across the two lasers is compared at that temperature at a comparator 36. During heating of the laser to bond it to a heatsink, the voltage across the device 10 increases. The voltage change thus provides an indication of the pn junction temperature and from this, the temperature at the bonding interface can be computed. The reason for using a reference laser instead of measuring the voltage change directly is that the temperature related characteristics of a laser can vary from crystal to crystal.

The assembly is taken to 170° C. to ensure that the indium is melted and is then cooled rapidly by reversing current polarity to the Peltier device 16. The top surface 14 then becomes a cooling surface and can cool the laser/heatsink combination to room temperature very rapidly.

Referring to FIG. 2(b), the characterization circuit includes a constant current source for directing a current of the order of 100 mA dc through the laser 10 via the conducting pick-up 26. A corresponding light output is monitored by a PIN photodiode 40. The laser can be switched between dc and pulsed generation at a switchable current controller which is driven by a switch controller the latter incorporating a pulse generator. The current controller switch SW$_1$, and a switch SW$_2$ controlling the PIN photodiode are ganged.

In operation, the laser is initilly driven by a dc current and then by a pulsed current having a peak level equal to the dc level, both currents being sufficiently high to take the laser above the lasing threshold so as to produce laser emission.

In the pulsed current mode, due to the low on-off ratio of the current, (about 1:200), heat is being generated only for very short durations, allowing the laser to cool for most of the time, causing practically no change in the temperature of the laser chip. In the dc mode however, the generation of heat in the laser is continuous, causing a steady flow of heat from the laser through the solder joint to the copper heatsink which is maintained at constant temperature. The flow of this heat current through the thermal resistance of the solder joint causes a proportional rise of the temperatures of the laser chip with respect to the copper heatsink.

The effect of the laser temperature increases to lower the laser light amplitude which is detected by an avalanche photodiode (APD) 28 mounted to receive light from one facet of the laser 10. Consequently the difference in the light output of the laser 10 for dc and pulsed operations is an indication of the operating temperature difference at the laser pn junction in these two operating modes. This, in turn, is an indication of the thermal resistance of the bond 20 between laser 10 and heatsink 16.

Using the technique of the invention, a laser chip 10 is bonded to a heatsink at a precise temperature, cooled, and the bond characterized very rapidly in a single location. Rapidity of operation is made possible by using a thermoelectric device 16 which can be utilized to very rapidly cool, heat or accurately set a reference temperature at the laser. This single location operation is made possible by using the floating contact 26.

What is claimed is:

1. A method of bonding a semiconductor laser chip to a heatsink comprising depositing solder on the heatsink, positioning and pressing the chip onto the solder, passing a small fixed current through the laser chip, applying regulated heat to the heatsink to render the solder molten, measuring a change in voltage across the laser chip caused by such heating to determine the temperature of a pn junction of said laser chip, regulating the applied heat on the basis of that predetermined temperature, and cooling the solder to render it solid and to bond the laser chip to the heatsink.

2. A method as claimed in claim 1, in which a current equal to said small fixed current is passed simultaneously through a reference laser maintained at a predetermined temperature and output signals from the two lasers are compared to determine the voltage change.

3. A method as claimed in claim 2, in which the reference laser and the laser being bonded have been cleaved from the same crystal wafer.

4. A method as claimed in claim 1, in which said solder is vapour deposited onto a top surface of the heatsink.

5. A method as claimed in claim 1, in which said heat is applied by means of a Peltier effect device, the heatsink being supported on a contact face of said Peltier effect device during bonding.

6. A method as claimed in claim 1, wherein said fixed current is directed to the laser through a conductive vacuum pick-up.

7. A method as claimed in claim 5, in which the Peltier effect device is operated in one mode to heat the solder to melt it and is operated in a reverse mode to cool the solder to produce a bond between the laser chip and the heatsink.

8. A method as claimed in claim 1, in which the solder contains indium.

9. A method as claimed in claim 1, further comprising setting a characterization temperature of the bonded laser chip and heatsink and passing a second relatively high current through the device in one mode as dc to produce a first light output, and in another mode pulsed to give a second light output, and comparing the light outputs to derive a thermal resistance of the bond between said chip and the heatsink.

10. A method as claimed in claim 9, in which said characterization temperature is monitored by means of a thermocouple attached to said heating means.

11. A method as claimed in claim 8, in which said currents pass to a top surface of the laser chip through a conducting vacuum pick-up.

12. Apparatus for use in bonding a semiconductor laser chip to a heatsink, said apparatus comprising:
   means for depositing solder on a heatsink;
   means for positioning and pressing the chip onto the solder;
   means for passing a small fixed current through the laser;
   means for applying regulated heat to the heatsink to render the solder molten;
   means for measuring a change in voltage across the laser caused by such heating to determine the temperature of a pn junction of said laser;
   means for regulating the applied heat on the basis of that determined temperature; and
   means for cooling the solder to render it solid and to bond the laser chip to the heatsink.

13. Apparatus as claimed in claim 12, in which the means for applying regulated heat and the means for cooling the solder to render it solid are common and comprise a Peltier effect thermoelectric device in which current of one polarity causes heating of a surface adjacent the laser chip and current of reverse polarity causes cooling of said surface.

14. Apparatus as claimed in claim 12, in which said means for passing a small fixed current through the laser and said means for positioning and pressing the chip onto the solder are common an comprise a vacuum pick-up plated with a conductive metal.

* * * * *